(12) United States Patent
Nakamura et al.

(10) Patent No.: US 6,822,277 B2
(45) Date of Patent: Nov. 23, 2004

(54) SEMICONDUCTOR DEVICE AND METHOD FOR MANUFACTURING THE SAME

(75) Inventors: Takashi Nakamura, Kyoto (JP); Hiroshi Tochimura, Kyoto (JP)

(73) Assignee: Rohm Co. Ltd., Kyoto (JP)

( * ) Notice: Subject to any disclaimer, the term of this patent is extended or adjusted under 35 U.S.C. 154(b) by 0 days.

(21) Appl. No.: 09/935,639

(22) Filed: Aug. 24, 2001

(65) Prior Publication Data

US 2002/0096737 A1 Jul. 25, 2002

(30) Foreign Application Priority Data

Aug. 24, 2000 (JP) ..................................... P2000-254291
Aug. 24, 2001 (JP) ..................................... P2001-254696

(51) Int. Cl.$^7$ ..................... H01L 21/700; H01L 21/375
(52) U.S. Cl. ..................... 257/295; 257/296; 257/298; 257/303; 257/306; 257/325
(58) Field of Search ................. 257/295, 296, 257/298, 303, 306, 325, 316

(56) References Cited

U.S. PATENT DOCUMENTS 6,133,092 A * 10/2000 Hayashi et al. .............. 438/256
6,492,222 B1 * 12/2002 Xing .......................... 438/240

* cited by examiner

Primary Examiner—Long Pham
Assistant Examiner—Shrinivas H. Rao
(74) Attorney, Agent, or Firm—Morgan, Lewis & Bockius LLP

(57) ABSTRACT

The present invention is characterized by including an electrode formed on surface of a semiconductor substrate, wherein said electrode includes a barrier layer consisting of amorphous or microcrystal expressed by the following expression:

$$M1_x M2_{1-x}$$

(0<X<1; M1: Au, Pt, Ir, Pd, Os, Re, Rh, Ru, Cu, Co, Fe, Ni, V, Cr; M2: Ta, Ti, Zr, Hf, W, Y, Mo, Nb).

18 Claims, 15 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same, particularly to a semiconductor device including a process forming dielectric film on an electrode consisting of material oxidized easily by high temperature process. Further, the present invention relates to a dielectric capacitor, particularly to improvement of ferroelectricity thereof.

2. Description of the Related Art

Ferroelectric memory (FeRAM) is a device having superior characteristics in non-volatile performance, constant electric power operation, high speed writing-in, high rewrite resistance, etc., and is attracted recent years.

A ferroelectric capacitor used for the ferroelectric memory is made by that a tungsten plug 3 is formed on an oxide silicon layer 2 formed on a silicon substrate 1 and that a lower electrode 5 consisting of platinum, a ferroelectric layer 6 consisting of PZT ($PbZr_xTi_{1-x}O_3$) film, and an upper electrode 7 consisting of platinum are laminated as shown in FIG. 17.

Using platinum for the lower electrode 5 is caused by the following reason. A PZT film must be formed on an orientation film. This is because forming it on an amorphous film damages ferroelectric performance, as orientation performance is bad. On the other hand, the lower electrode 5 must be formed at state insulated from the silicon substrate 1. Because of that, an oxide silicon layer 2 is formed on the silicon substrate 1. The oxide silicon layer 2 is amorphous. Generally, although film formed on amorphous becomes non-orientation film, platinum has a characteristic becoming an orientation film even if formed on the amorphous film. By this reason, platinum is often used for the lower electrode.

However in the above-mentioned, conventional ferroelectric capacitor, there are the following problems.

There is a problem that ferroelectric performance decreases by escapement of oxygen in the ferroelectric (PZT), aging, and repeat of polarization inversion because oxygen easily permeates through platinum. That is, there is the possibility that oxygen in the ferroelectric escapes between columnar crystals of the platinum as shown in FIG. 18.

Further, the problem such as this appears not only in the ferroelectric memory but also similarly as in the capacitor using ferroelectric having high dielectric constant.

Further, although tantalum silicon nitride (TaSiN) is proposed for wiring barrier layer up to now, there is a problem that nitrogen generates upon oxidation and oxide film is formed by later heat treatment even in such wiring so as to decrease conductivity.

SUMMARY OF THE INVENTION

An object of the present invention is to provide a ferroelectric capacitor or ferroelectric capacitor having high dielectric constant which deteriorate less by aging and repeat of polarization inversion not only at manufacturing, by solving the above-mentioned problem, preventing oxidation of substrate material.

Another object of the present invention is to provide a semiconductor device having wiring high in reliability without increase of resistivity.

In the present invention, "capacitor" indicates a structure providing electrodes at both sides of an insulator and includes any structure regardless of being used for storing electric charge or not.

The first aspect of the present invention is characterized by including an electrode formed on surface of a semiconductor substrate, wherein said electrode includes a barrier layer consisting of amorphous or microcrystal expressed by the following expression: $M1_xM2_{1-x}$ (0<x<1; M1: Au, Pt, Ir, Pd, Os, Re, Rh, Ru, Cu, Co, Fe, Ni, V, Cr; M2: Ta, Ti, Zr, Hf, W, Y, Mo, Nb).

Further, said surface of semiconductor substrate is constructed by at least one kind of polysilicon, tungsten, cobalt, molybdenum, copper, these silicide, and alloy.

Another aspect of the present invention is characterized by comprising: a lower electrode formed on a semiconductor substrate; a dielectric layer formed on said lower electrode and constructed by ferroelectric or dielectric having high dielectric constant; and an upper electrode formed on said dielectric layer, wherein said lower electrode includes a barrier layer consisting of amorphous or microcrystal expressed by the following: $M1_xM2_{1-x}$ (0<x<1; M1: Au, Pt, Ir, Pd, Os, Re, Rh, Ru, Cu, Co, Fe, Ni, V, C; M2: Ta, Ti, Zr, Hf, W, Y, Mo, Nb).

Another aspect of the present invention is characterized by having: a lower electrode formed on a semiconductor substrate; a dielectric layer formed on said lower electrode and constructed by ferroelectric or dielectric having high dielectric constant; and an upper electrode formed on said dielectric layer, wherein said electrode includes a barrier layer consisting of amorphous or microcrystal between said dielectric layer and said upper electrode expressed by the following expression: $M1_xM2_{1-x}$ (0<x<1M1: Au, Pt, Ir, Pd, Os, Re, Rh, Ru, Cu, Co, Fe, Ni, V, Cr; M2: Ta, Ti, Zr, Hf, W, Y, Mo, Nb).

Another aspect of the present invention is characterized by including an electrode formed on surface of a semiconductor substrate, wherein said electrode is constructed by amorphous or microcrystal single layer expressed by the following expression: $M1_xM2_{1-x}$ (0<x<1; M1: Au, Pt, Ir, Pd, Os, Re, Rh, Ru, Cu, Co, Fe, Ni, V, Cr; M2: Ta, Ti, Zr, Hf, W, Y, Mo, Nb).

Another aspect of the present invention is characterized by including process forming an electrode formed on surface of a semiconductor substrate and process forming a dielectric film on the upper layer thereof, wherein process forming said electrode includes process forming a barrier layer consisting of amorphous or microcrystal expressed by the following expression: $M1_xM2_{1-x}$ (0<x<1; M1: Au, Pt, Ir, Pd, Os, Re, Rh, Ru, Cu, Co, Fe, Ni, V, Cr; M2: Ta, Ti, Zr, Hf, W, Y, Mo, Nb).

Another aspect of the present invention is characterized by including: process forming a lower electrode on surface of a semiconductor substrate; process forming a dielectric layer consisting of ferroelectric or dielectric having high dielectric constant on said lower electrode; and process forming an upper electrode on said dielectric layer, wherein said process forming the lower electrode includes process forming amorphous or microcrystal expressed by the following expression so as to form a dielectric capacitor: $M1_xM2_{1-x}$ (0<x<1; M1: Au, Pt, Ir, Pd, Os, Re, Rh, Ru, Cu, Co, Fe, Ni, V, Cr; M2: Ta, Ti, Zr, Hf, W, Y, Mo, Nb).

Another aspect of the present invention is characterized by including: process forming a lower electrode on a semiconductor substrate; process forming a dielectric layer consisting of ferroelectric or dielectric having high dielectric constant on said lower electrode; process forming a barrier layer consisting of amorphous or microcrystal expressed by the following expression on said dielectric layer: $M1_xM2_{1-x}$ (0<x<1; M1: Au, Pt, Ir, Pd, Os, Re, Rh, Ru, Cu, Co, Fe, Ni, V, Cr; M2: Ta, Ti, Zr, Hf, W, Y, Mo, Nb); and process forming an upper electrode on said barrier layer so as to form a dielectric capacitor.

Another aspect of the present invention is characterized by including an electrode formed on surface of a semiconductor substrate, wherein said electrode is constructed by amorphous or microcrystal single layer expressed by the following expression: $M1_xM2_{1-x}$ (0<x<1; M1: Au, Pt, Ir, Pd, Os, Re, Rh, Ru, Cu, Co, Fe, Ni, V, Cr; M2: Ta, Ti, Zr, Hf, W, Y, Mo, Nb).

A semiconductor device of the present invention includes a barrier layer consisting of amorphous or microcrystal between an electrode and a dielectric layer expressed by the following expression: $M1_xM2_{1-x}$ (0<x<1; M1: Au, Pt, Ir, Pd, Os, Re, Rh, Ru, Cu, Co, Fe, Ni, V, Cr; M2: Ta, Ti, Zr, Hf, W, Y, Mo, Nb).

According to such the structure, barrier effect is large so as to prevent mutual diffusion of oxygen etc. and spike because the barrier layer consisting of the amorphous or microcrystal does not have clear grain boundary. Such the compound can keep the state of amorphous or microcrystal without crystallization at forming film temperature of dielectric layer. Therefore, escape of oxygen from dielectric layer can be prevented so as to depress aging of dielectric characteristic. Dielectric thin film formed on the amorphous or microcrystal is good in orientation performance so as to be possible to provide dielectric structure high in reliability.

When surface of the electrode is material oxidized at crystallization temperature of dielectric layer, there is a problem that resistivity is increased by oxidation of the electrode surface in the case that the barrier layer of the present invention does not exist. However, according to the present invention, escapement of oxygen from the dielectric layer can be surely prevent so as to depress aging of dielectric characteristic. According to fore-mentioned aspects, ferroelectric layer may consist of a PZT. In the PZT, thermal treatment of 700° C., 1 to 60 minutes after painting is necessary for forming film by Sol-Gel method. According to spattering method, substrate temperature or thermal treatment temperature becomes about 700° C. According to MOCVD method, substrate temperature becomes about 600 to 650° C. However, according to such the method, barrier layer of the present invention keeps amorphous or microcrystal state even when substrate temperature becomes about 700° C. Said barrier layer is stable and makes it possible to suppress increase of resistivity without generation of gas.

Although barrier layer of the present invention is amorphous or microcrystal, dielectric layer good in crystal orientation performance can be formed when dielectric layer is formed on the upper layer.

Therefore, a dielectric capacitor good in ferroelectric performance and high dielectric performance can be provided.

Even by the method of the present invention, escapement of oxygen from the dielectric layer is surely prevented by existence of the barrier similarly, and aging of dielectric characteristic can be depressed not only at forming film.

Especially, crystallization temperature of IrTa is more than 900° C., and there are generation of gas at oxidation and decrease of conductivity. Further, amorphous or microcrystal state is kept, and thin film forming good in orientation performance to the upper layer becomes possible when dielectric film is formed on the upper layer.

A semiconductor device of the present invention is characterized by that having an electrode formed on a surface of a semiconductor substrate, wherein said electrode includes an amorpous or microrcrystal barrier layer which includes at least an element chosen from a first group of Au, Pt, Ir, Pd, Os, Re, Rh, Ru, Cu, Co, Fe, Ni, V and Cr and at least an element chosen from a second group of Ta, Ti, Zr, Hf, W, Y, Mo and Nb. A barrier effect is kept good with a ternary chemical compound or higher is used as a barrier layer. Matching grating constant becomes easier, making it possible to form an electrode with an excellent boundary characteristics.

The present invention is effective not only in the case of dielectric capacitor but in the case with heating process in oxidation atmosphere after forming wiring layer.

The followings are applicable for the barrier layer $M1_xM2_{1-x}$ used in the present invention:
$Au_{0.4}Fe_{0.6}$, $Au_{0.35}Ti_{0.65}$, $Au_{0.35}Zr_{0.65}$, $Co_{0.40}Hf_{0.60}$, $Co_{0.5}Mo_{0.5}$, $Co_{0.5}Ta_{0.5}$, ... CoTi, CoW, CoY, CoZr, CrTi, CrTi, CuHf, CuTa, CuZr, FeMo, FeTi, FeW, FeY, FeZr, HfNi, HfV, IrNb, IrTa, MoNi, MoRe, MoRu, MpZr, NbNi, NbPd, NbRh, NiTa, NiTI, NiW, NiY, NiZr, OsTa, OsW, PdTi, PtW, PtZr, ReTa, ReW, RhZr, RuW, RuZr, VZr, and WZr.

Further, other than the above listed binary chemical compounds, a barrier layer of either amorphous or microcrystal of ternary chemical compounds or higher composed of at least an element from a first group of Au, Pt, Ir, Pd, Os, Re, Rh, Ru, Cu, Co, Fe, Ni, V and Cr and at least an element from a second group of Ta, Ti, Zr, Hf, W, Y, Mo and Nb, such as IrTiPt for example, is applicable.

The composition ratio is changeable suitably, and it is possible to raise grid consistency between the substrate and the upper layer film by varying the composition ratio continuously. It is possible to obtain material near to objective value in function while raising grid consistency by varying the composition ratio continuously.

Because crystallization temperature changes greatly even by slight change of the composition ratio, suitable attention is required. In other words, it is possible to raise grid consistency and to provide a crystal thin film high in reliability while obtaining necessary characteristic.

Here, microcrystal is about 10 nm in crystal grain diameter or less, and grain boundary is not penetrated all over thickness of film.

DESCRIPTION OF THE PREFERRED EMBODIMENTS

Figure 1:
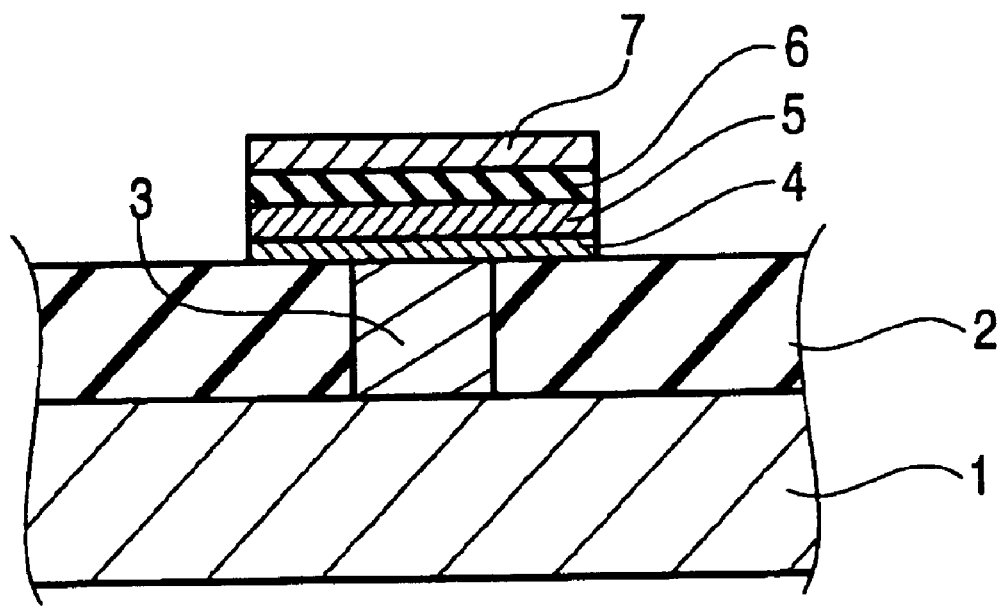
FIG. 1 is a view showing the structure of ferroelectric capacitor according to the first embodiment out of the present invention.

FIG. 1 shows a structure of a dielectric capacitor according to a first embodiment of the present invention.

The dielectric capacitor according to a first embodiment of the present invention comprises a lower electrode 5 consisting of Ir layer of 100 nm thickness formed on a tungsten plug 3 of the conventional dielectric capacitor and a ferroelectric layer 6 consisting of PZT of 210 nm thickness, and it is characterized in that said lower electrode 5 further has a barrier layer 4 consisting of $Ir_{0.4}Ta_{0.6}$ of 100 nm thickness at the tungsten plug 3 side as shown in FIG. 1.

Figure 2:
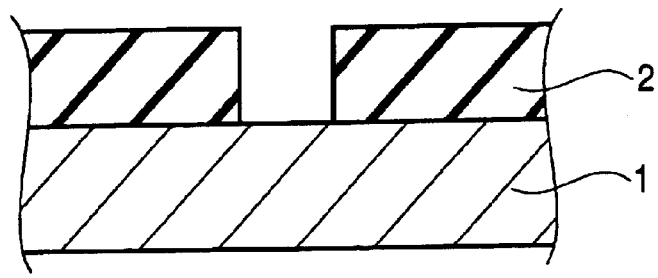
FIGS. 2(a) to 2(e) are views showing the manufacturing process of ferroelectric capacitor according to the first embodiment of the present invention.
Figure 2:
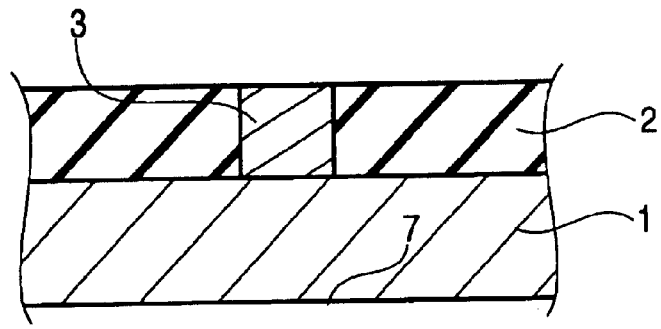
Figure 2:
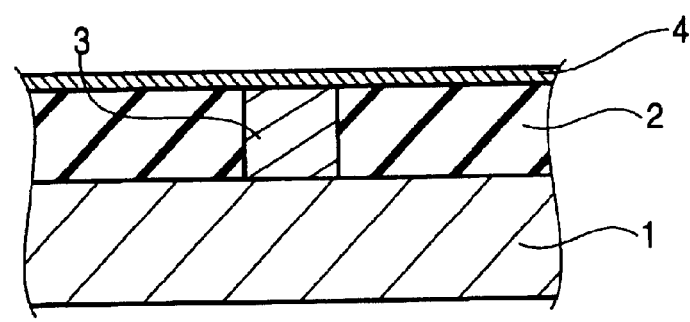
Figure 2:
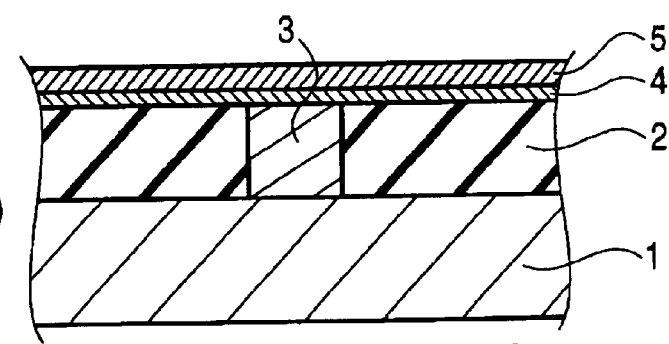
Figure 2:
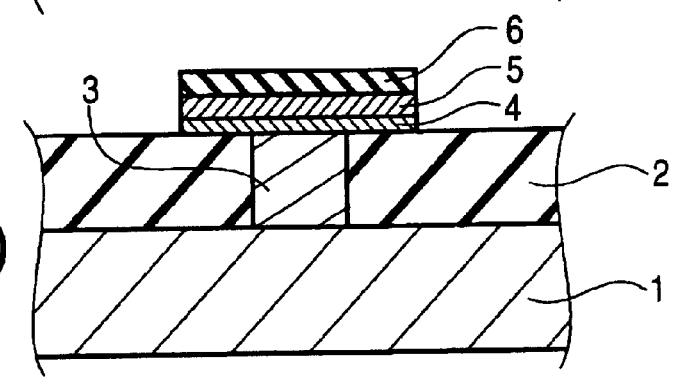

That is, in the present invention, after forming oxide silicon layer 2 on a silicon substrate 1 with the desired element domain, a contact hole is formed on a silicon substrate 1 as shown in FIG. 2(a).

After forming Ti layer and TiN layer not shown, tungsten is buried in the contact hole by CVD method using $WF_6$ as shown in FIG. 2(b) so as to form the tungsten plug 3.

As shown in FIG. 2(c), the barrier layer 4 consisting of $Ir_{0.4}Ta_{0.6}$ of 100 nm thickness is formed by spattering method.

After this, the lower electrode 5 consisting of Ir layer of 100 nm thickness by spattering method as shown in FIG. 2(d).

After patterning said barrier layer and lower electrode 5, the PZT thin film is formed on the upper layer by solge method as shown in FIG. 2(e). Ferroelectric layer is formed through crystallization anneal process of 625° C. one minute by rapid thermal annealing (RTA) method.

Finally, an upper electrode 7 is formed so as to complete ferroelectric memory.

According to such structure, a ferroelectric memory stable and high in reliability is completed without increase in sheet resistance of the lower electrode.

There is not any oxidation of W and IrTa nor peeling-off of film after the annealing process, and it becomes possible to obtain a ferroelectric memory high in reliability.

Figure 3:
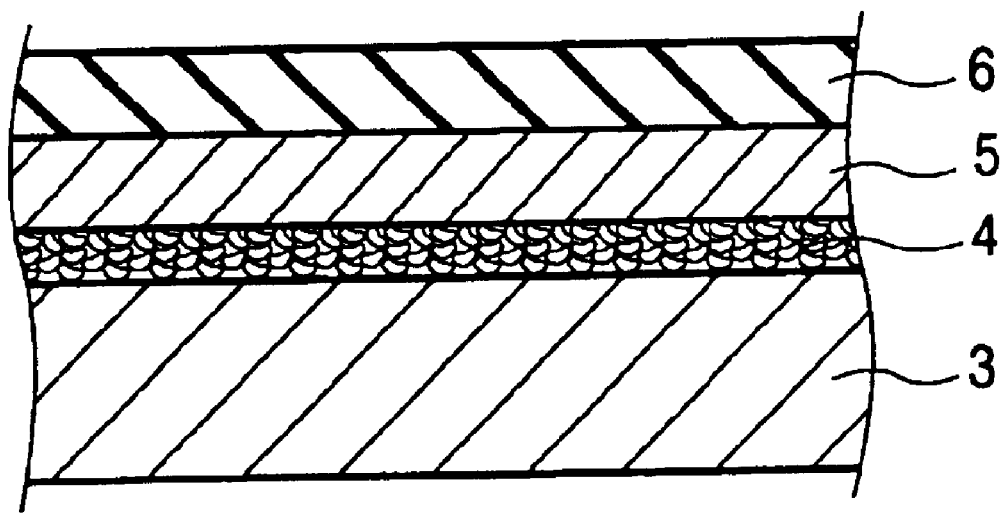
FIG. 3 is a view describing ferroelectric capacitor according to the first embodiment of the present invention.
Figure 4:
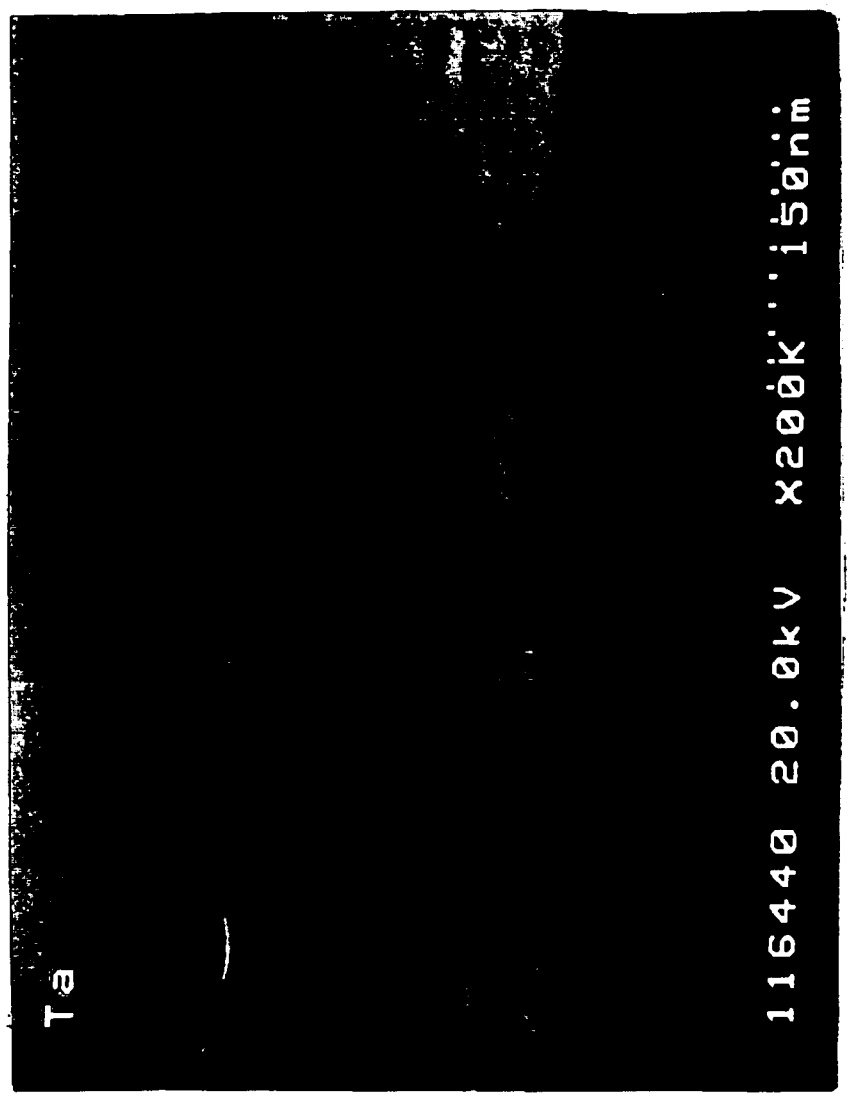
FIG. 4 is a SEM picture showing composition ratio of Ta and forming film state according to the second embodiment of the present invention.
Figure 5:
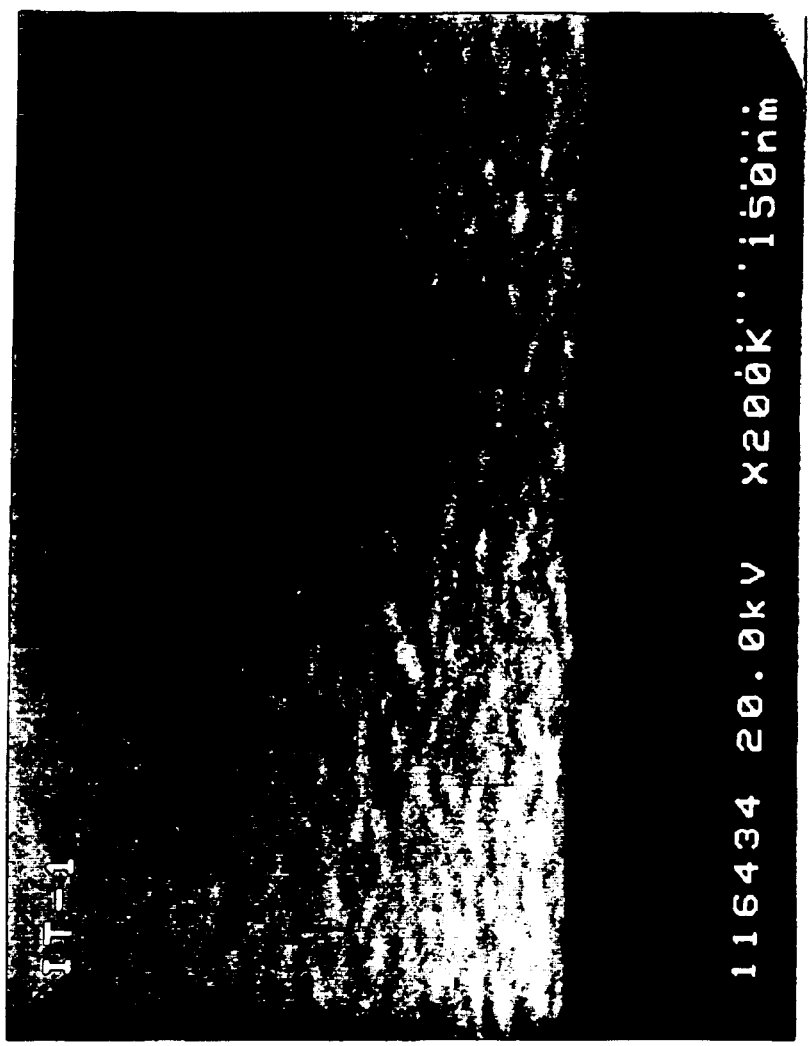
FIG. 5 is a SEM picture showing composition ratio of IrTa and forming film state according to the second embodiment of the present invention.
Figure 6:
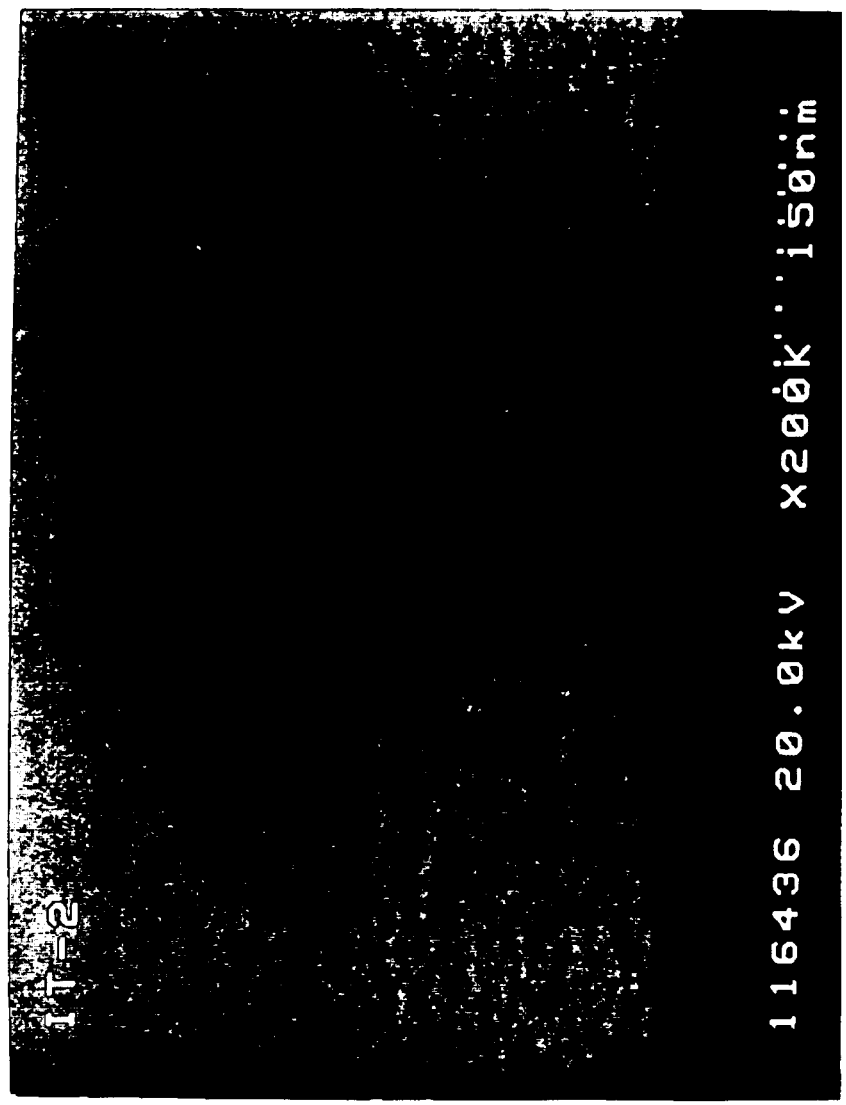
FIG. 6 is a SEM picture showing composition ratio of IrTa and forming film state according to the second embodiment of the present invention.
Figure 7:
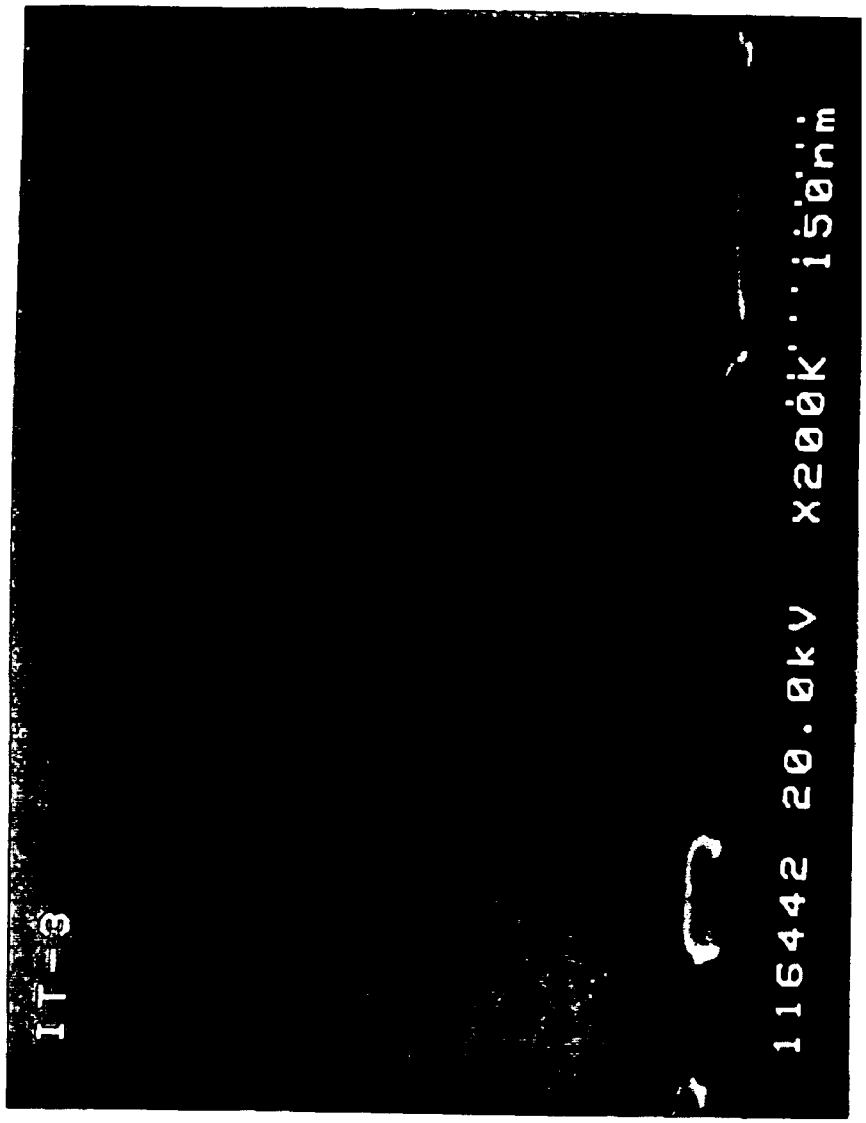
FIG. 7 is a SEM picture showing composition ratio of IrTa and forming film state according to the second embodiment of the present invention.
Figure 8:
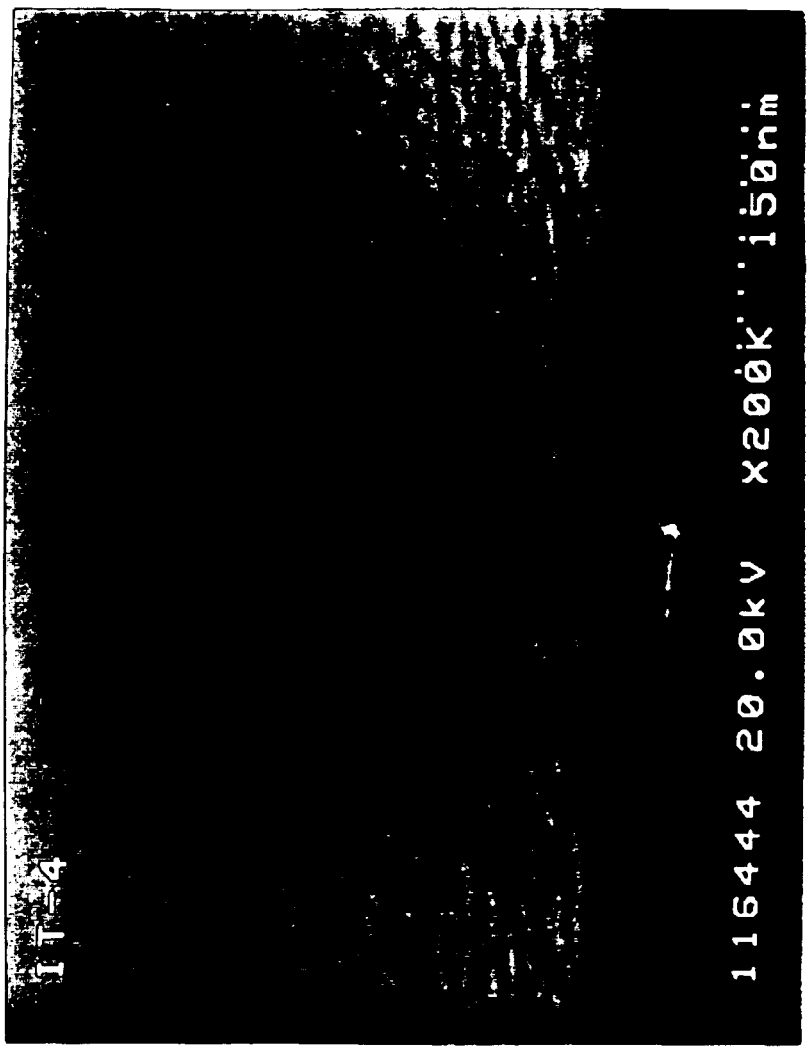
FIG. 8 is a SEM picture showing composition ratio of IrTa and forming film state according to the second embodiment of the present invention.
Figure 9:
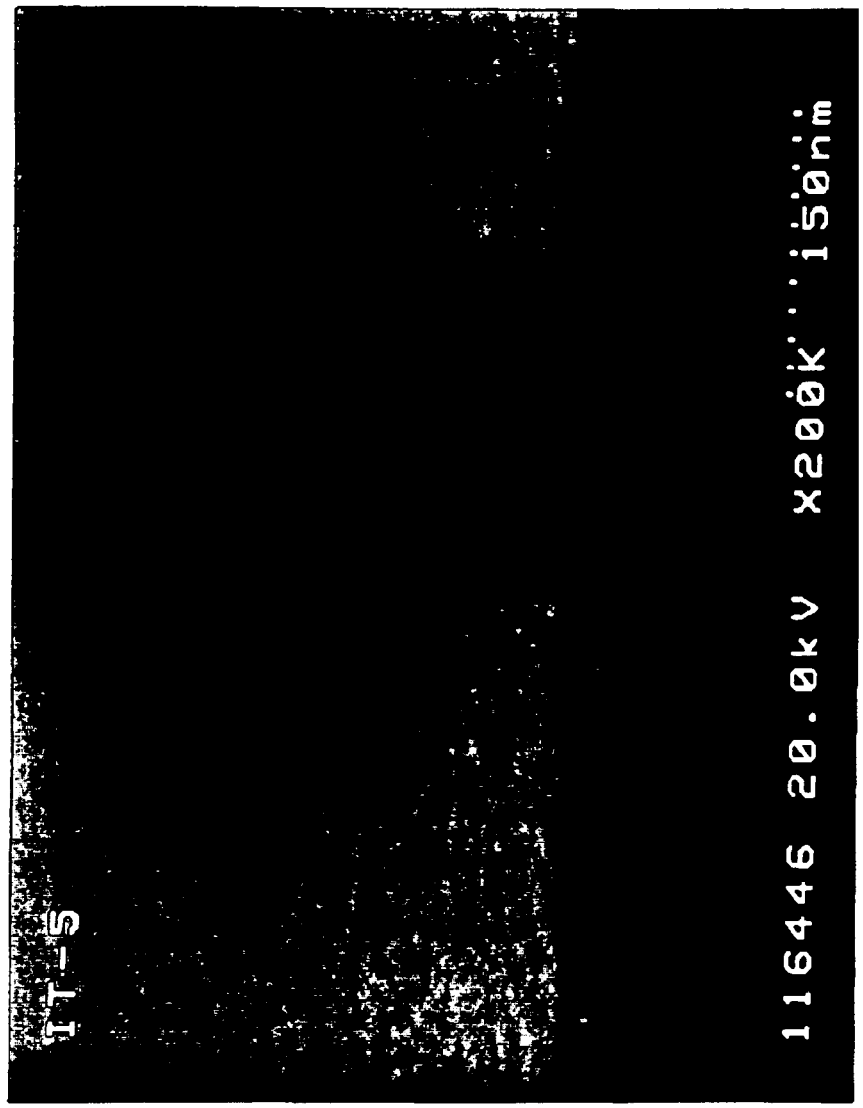
FIG. 9 is a SEM picture showing composition ratio of IrTa and forming film state according to the second embodiment of the present invention.
Figure 10:
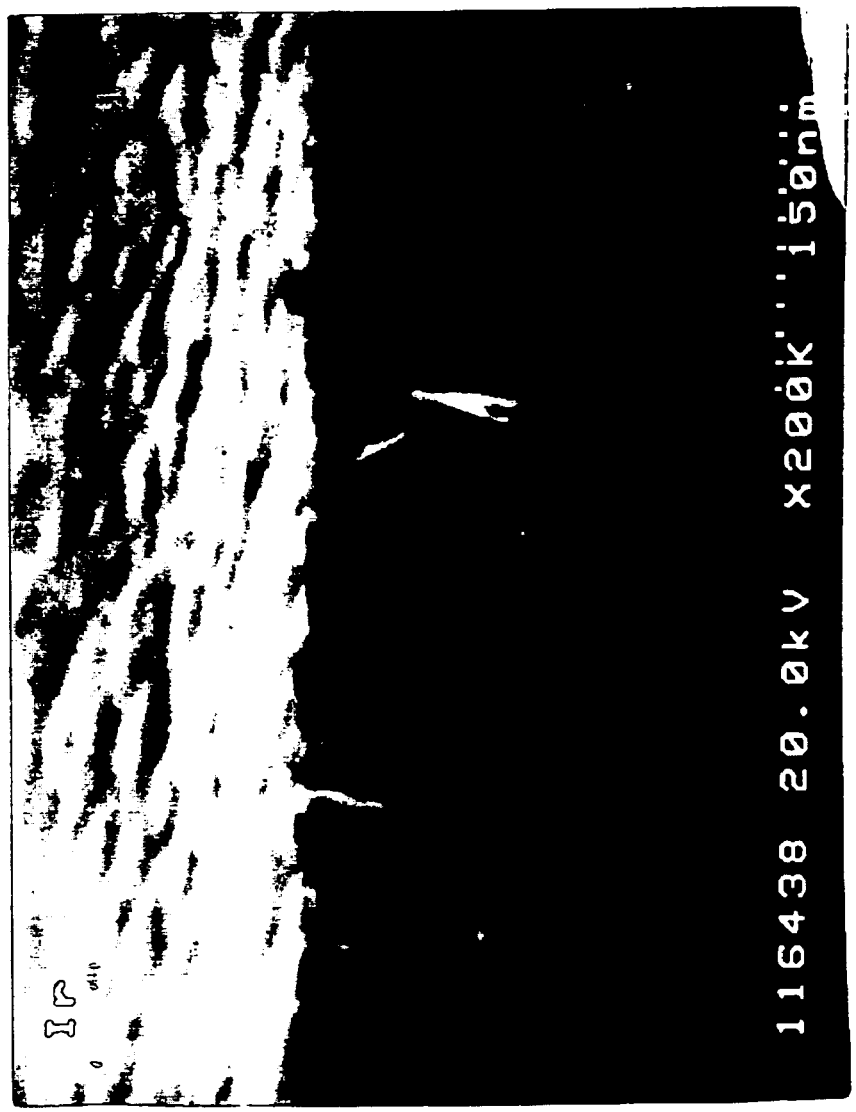
FIG. 10 is a SEM picture showing composition ratio of Ir and forming film state according to the second embodiment of the present invention.

Since the ferroelectric memory formed by such the way is constructed by amorphous $Ir_{0.4}Ta_{0.6}$ at the barrier layer 4, oxygen in ferroelectric layer is obstructed to penetrate at the barrier layer as shown in FIG. 3.

Therefore, it becomes possible to form a ferroelectric memory having no current leakage and being long life and high in reliability.

Sheet resistance value of laminated body of amorphous $Ir_{0.4}Ta_{0.6}$ layer of 100 nm thickness and Ir layer of 100 nm thickness is $1\times10^{-1}$ Ω, and this is no problem as material for electrode.

Because Ir is a cylindrical crystal, the ferroelectric film 6 formed on the upper layer thereof has very good orientation. Although a little amount of oxygen in the ferroelectric film 6 penetrates through Ir, oxygen having penetrated deposits around the cylindrical crystal as $IrO2$ so as to raise barrier performance. On the other hand, because amorphous $Ir_{0.4}Ta_{0.6}$ layer is further in barrier performance, oxygen in the ferroelectric film does not penetrate to the substrate side by existence of these two layer films (the Ir layer 5 and the amorphous $Ir_{0.4}Ta_{0.6}$ layer 4).

Thus, ferroelectric performance of the ferroelectric film 6 improves drastically.

Although the amorphous $Ir_{0.4}Ta_{0.6}$ layer 4 is formed only on the lower electrode 5 in said embodiment, penetration of oxygen in the ferroelectric film is surely prevented by forming the amorphous $Ir_{0.4}Ta_{0.6}$ layer on the upper electrode 7 as well. However, effect of some degree can be obtained by only either of them. Further, IrTaPt layer, comprising IrTa and additive Pt, is also effective.

The above-mentioned ferroelectric capacitor can be used as a nonvolatile memory by connecting one side of source-drain of a transistor and an upper or lower electrode. Further, it is needless to say that the above mentioned capacitor is applicable for a nonvolatile memory of FET structure using ferroelectric film sandwiched between electrodes as an electrode.

Next, composition of $Ir_xTa_{1-x}$ will be described as a second embodiment of the present invention. The rest of the structures are similar to those in fore-mentioned first embodiment.

Varying composition ratio x of Ir, $Ir_xTa_{1-x}$ layer is formed on a silicon substrate by reactive spattering method. The forming film conditions are shown in the following table.

TABLE 1

| Composition ratio | Crystal performance | Film performance |
|---|---|---|
| Ta | Polycrystal | |
| $Ir_{0.2}Ta_{0.8}$ | Amorphous | Good |
| $Ir_{0.4}Ta_{0.6}$ | Amorphous | Excellent |
| $Ir_{0.5}Ta_{0.5}$ | Amorphous | Good |
| $Ir_{0.6}Ta_{0.4}$ | Microcrystal | |
| $Ir_{0.8}Ta_{0.2}$ | Microcrystal | |
| Ir | Cylindrical polycrystal | |

Crystal performance of film and film performance obtained by the result is shown in the following table.

TABLE 2

|   | Ta | $Ir_{0.2}Ta_{0.8}$ | $Ir_{0.4}Ta_{0.6}$ | $Ir_{0.5}Ta_{0.5}$ | $Ir_{0.6}Ta_{0.4}$ |
|---|---|---|---|---|---|
| P | 400 | 60/400 | 150/400 | 140/230 | 200/210 |
| G | Ar | Ar | Ar | Ar | Ar |
| F | 20 | 20 | 20 | 20 | 20 |
| R | 5 | 9.6 | 18.4 | 10.1 | 10.7 |

|   | $Ir_{0.8}Ta_{0.2}$ | Ir |
|---|---|---|
| P | 200/60 | 200 |
| G | Ar | Ar |
| F | 20 | 20 |
| R | 9 | 8.5 |

P: Power (W)
G: Spatter gas
F: Gas flow (sccm)
R: forming film rate (nm/min)

Further, SEM pictures of this time are shown in FIGS. 4 to 10. Here, in FIGS. 4 to 9, Ta and $Ir_xTa_{1-x}$ (X=0.2, 0.4, 0.5, 0.6, 0.8: $Ir_{0.2}Ta_{0.8}Ir_{0.4}Ta_{0.6}Ir_{0.5}Ta_{0.5}Ir_{0.6}Ta_{0.4}Ir_{0.8}Ta_{0.2}$) are formed on surface of oxide silicon film through silicon film, and in FIG. 10, iridium is formed on surface of oxide silicon film. A part at boundary shown white in the picture is a silicide.

Amorphous state is obtained when content of iridium is 20 to 50% from the result of XRD and the above-mentioned SEM. When content of iridium is 60 to 80%, microcrystal state is obtained. According to the result of SEM, when content of iridium is 40%, it is known that there is not crystal grain and the best amorphous state is obtained.
Amorphous state gives better barrier performance. This is because oxygen permeation (diffusion) is most part permeation in crystal boundary, so that amorphous state gives higher performance in anti-diffusion effect.
On the other hand, with regard to ferroelectric film which is formed above this barrier layer, employing microcrystal for barrier layer makes it possible to obtain better orientation, if microcrystal composing a barrier layer can be orientated.

Next, as a third embodiment of the present invention, resistivity after annealing are measured varying composition of barrier layer in each case of iridium and platinum as an electrode, respectively.

Figure 11:
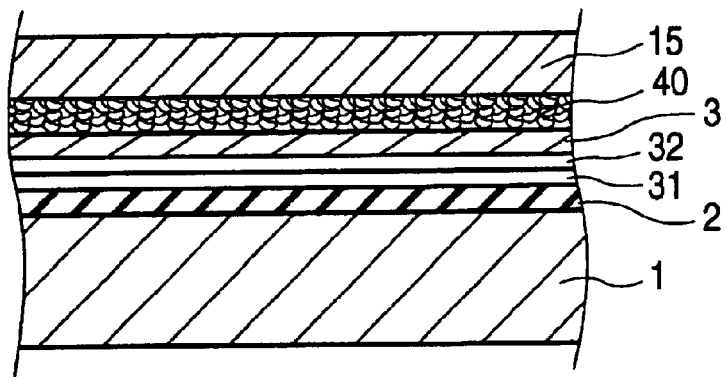
FIG. 11 is a view showing the structure of semiconductor device according to the third embodiment of the present invention.

First, a titanium layer 31 of 40 nm thickness of film and a titanium nitride layer 32 of 80 nm of film thickness are formed on surface of a silicon substrate 1 as adhesive above oxide silicon as shown in FIG. 11. On an upper layer thereof, a tungsten film 3 of 800 nm thickness of film is formed, and thereon amorphous $Ir_{0.4}Ta_{0.6}$ layer of 100 nm thickness as a barrier layer 40 is formed so that an electrode 15 consisting of iridium layer of 100 nm thickness.

Figure 12:
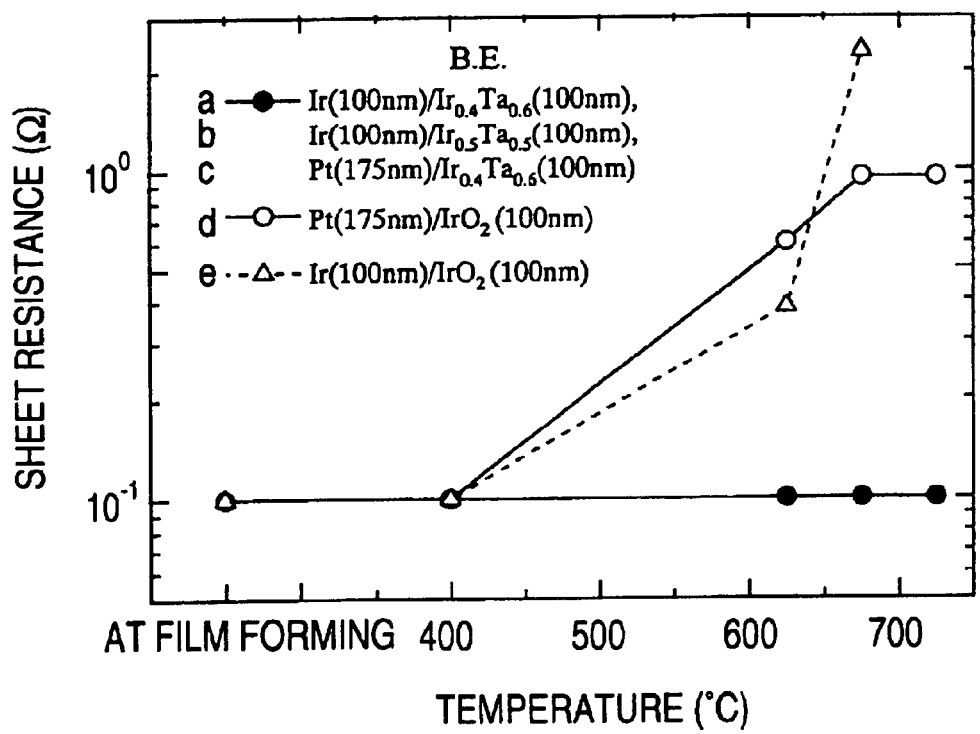
FIG. 12 is a view showing relation of annealing temperature and sheet resistance of the semiconductor device.

After forming film with the structure, in order to observe resistivity change by oxidation of barrier material after thermal treatment, sheet resistances at each temperature are measured by varying annealing temperature, annealing at an interval of 50° C. from 625° C. by RTA after oxide annealing of 400° C., 30 minutes using a horizontal furnace. The result of the measurement is shown in FIG. 12 with the curve a. Cross-section observation by SEM is carried out to observe oxidation of W and IrTa, and state of film peeling-off after annealing.

As the result, it is known that there is no increase of sheet resistance to about 700° C. and sheet resistance is kept excellently without oxidation of tungsten. At 775° C., peeling-off appears. Although oxidation of IrTa is seemed to start a little at 675° C., oxidation of W is depressed to 700° C. At 775° C., peeling-off appears.

Next, changing amorphous $Ir_{0.4}Ta_{0.6}$ layer of 100 nm thickness of film, as a barrier layer 40 to amorphous $Ir_{0.5}Ta_{0.5}$ layer, the rest is formed similarly with the above and then similar measurement is carried out. The result is shown with the curve b.

As a result, in the above-mentioned structure, oxidation of IrTa starts a little at RTA 625° C., and oxidation of W occurs at 775° C.

Further, using amorphous $Ir_{0.4}Ta_{0.6}$ layer of 100 nm thickness of film as a barrier layer 40, forming platinum layer of 100 nm thickness of film as an electrode 15, later process is formed as similar as the above and then similar measurement is carried out. The result is shown with the curve c.

As a result, in the above-mentioned structure, oxidation of IrTa starts a little at RTA 625° C., and oxidation of W occurs at 775° C. Because barrier performance of iridium itself is higher than platinum in the structure of the above-mentioned a, oxidation of IrTa starts a little at RTA 625° C.

Further as comparison example, forming oxide iridium $IrO_2$ layer of 100 nm thickness of film as a barrier layer 40, using iridium and platinum of 100 nm thickness of film each for an electrode 15, later process is formed as similar as the above and then similar measurement is carried out for each of iridium and platinum electrode 15. The result is shown with the curves d and e.

As the result, in the above-mentioned structure, IrTa is oxidized a little and expanded at RTA 725° C., and peeling-off occurs at the boundary of W.

From the above comparison, oxidation of tungsten can not be stopped at step of RTA 625° C. when oxide iridium is used for the barrier layer. It is known by SEM observation that oxidation of IrTa itself occurs from RTA 625° C. though there is no change of sheet resistance in IrTa.

Further it is known that iridium is higher in oxygen barrier performance and better oxygen barrier effect is obtained by using iridium than platinum for the electrode.

Although oxide iridium is formed on the surface, excellent barrier effect can be obtained because resistivity of the oxide iridium is low and oxygen barrier performance is very high.

Next, a fourth embodiment of the present invention will be described. Since oxidation of the barrier layer itself can not be prevented in said third embodiment, a structure able to prevent oxidation of the barrier layer itself will be described.

Figure 13:
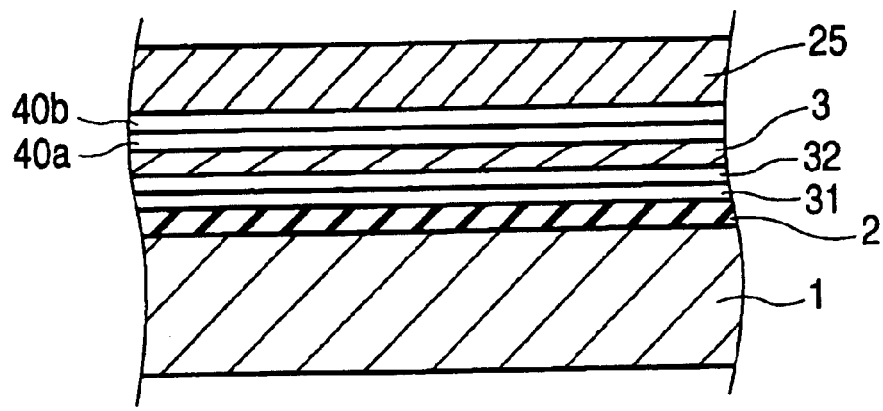
FIG. 13 is a view showing the structure of semiconductor device according to the fourth embodiment of the present invention.

As shown in FIG. 13, making the thickness of film of the barrier layer half to form amorphous $Ir_{0.4}Ta_{0.6}$ layer 40a of 50 nm thickness of film, on the upper layer thereof, amorphous $Ir_{0.2}Ta_{0.8}$ layer 40b of 50 nm thickness of film is laminated so as to be a barrier layer of double construction. A platinum layer 25 of 100 nm thickness of film is used for an electrode. Another construction is formed similarly with said third embodiment.

Resistivity after annealing is measured. As the result, it is known that oxidation of the barrier layer occurs a little at RTA 675° C. and oxidation of tungsten starts.

Next, varying composition of the upper side layer of the double barrier structure, the similar measurement is carried out. That is, making thickness of film of the barrier layer half to form amorphous $Ir_{0.4}Ta_{0.6}$ layer 40a of 50 nm thickness of film, on the upper layer thereof, a barrier layer of double structure laminating amorphous $Ir_{0.2}Ta_{0.8}$ layer 40b of 50 nm thickness of film and a barrier layer of double structure forming amorphous $IrO_2$ layer 40b of 50 nm thickness of film at upper side are formed.

As the result, it is known that oxidation of W occurs at RTA 625° C.

In $Pt/Ir_{0.8}Ta_{0.2}/Ir_{0.4}Ta_{0.6}/W$ structure, oxidation of $Ir_{0.4}Ta_{0.6}$ starts at RTA 625° C. and oxidation of W occurs at RTA 675° C.

Further, in $Pt/Ir_{0.2}Ta_{0.8}/Ir_{0.4}Ta_{0.6}/W$ structure, oxidation of $Ir_{0.2}Ta_{0.8}$ and $Ir_{0.4}Ta_{0.6}$ starts at RTA 675° C. and oxidation of W occurs at RTA 725° C.

Therefore, when $Ir_{0.2}Ta_{0.8}$ is laminated in the structure, it is known that barrier effect is high. It becomes possible to keep good characteristic without oxidation of tungsten at low temperature process of less than 625° C.

Although an electrode with barrier layer is explained in each of fore-mentioned embodiments of second through fourth, an electrode of the present invention is effective and provide an electrode with low resistance and high reliability in the following cases as well: in a-case wherein a layer of ferroelectric or dielectric with high dielectric constant is formed above to form a capacitor, or in a case where a high temperature processing process is included in later processing when forming devices such as electro-luminescence (EL) element, etc.

Next, a fifth embodiment of the present invention will be described. In this example, forming a barrier layer in three layer structure, using a platinum layer of 100 nm thickness of film for an electrode 15, a ferroelectric layer 6 consisting of PZT layer is formed. Here, in order to resist RTA of 740° C., the following three layer structure is formed: a first barrier layer 41 consisting of IrO2 as a barrier agaist oxygen passing through an electrode 15 consisting of Pt; Ir layer added as a second barrier to barrier oxygen passing through IrO2 or oxygen from the $Iro_2$ itself; and a third barrier layer 43, as which IrTa is used, serving as a bonding layer of Ir and W (tungsten plug layer 3).

Figure 14:
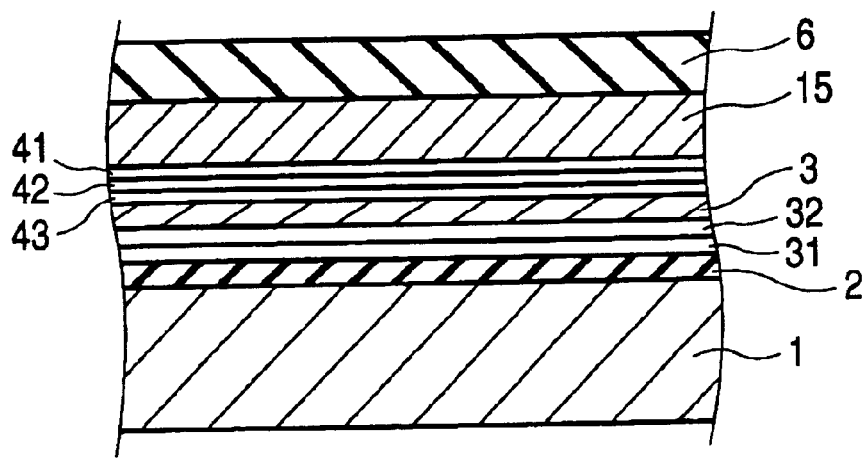
FIG. 14 is a view showing the structure of ferroelectric memory according to the fifth embodiment of the present invention.

That is, as shown in FIG. 14, a barrier layer of three layer structure is formed in which the first barrier layer 41 consisting of $IrO_2$ layer of 65 nm thickness of film, the second barrier layer 42 consisting of iridium layer of 50 nm thickness of film, and the amorphous $Ir_{0.4}Ta_{0.6}$ layer 43 of 50 nm thickness of film are laminated from the electrode 15 side consisting of platinum layer. The structure of the substrate is formed as similarly as said third embodiment.

Next, a method for manufacturing a ferroelectric capacitor using electrode structure according to the fifth embodiment of the present invention.

First, thermal oxidation is carried out at surface of the silicon substrate 1, and an oxide silicon layer 2 is formed. Here, thickness of the oxide silicon layer 2 is made 600 nm.

Next, using titanium for target, a titanium layer 31 of 40 nm thickness of film and a titanium nitride layer 32 of 80 nm thickness of film are formed by reactive spattering.

Then, a W layer 3 is formed by CVD method using $WF_6$.

After that, a third barrier layer 43 consisting of amorphous $Ir_{0.4}Ta_{0.6}$ layer of 50 nm thickness of film is formed by reactive spattering method, on upper layer thereof a second barrier layer 42 consisting of iridium layer of 50 nm thickness of film is formed, on upper layer thereof a first barrier layer 41 consisting of $IrO_2$ layer of 65 nm thickness of film, and further on upper layer thereof an electrode 6 consisting of platinum layer of 100 nm thickness.

Next, PZT film is formed for ferroelectric layer 6 on the (lower) electrode 15 by Sol-Gel method. As starting material, mixed solution of $Pb(CH_3COO)_2 \cdot 3H_2O$, $Zr(t\text{-}OC_4H_9)_4$, $Ti(i\text{-}OC_3H_7)_4$ is used. After spin-coating the mixed solution, drying it at 150° C., temporary burning is carried out for 30 seconds at 400° C. in dry air atmosphere. After repeating it 5 times, thermal treatment of 400° C., 30 minutes is carried out in $O_2$ atmosphere. A ferroelectric layer 6 consisting of PZT layer of 210 nm thickness is formed by carrying out crystallization anneal of RTA 740° C. Here, in $PbZr_xTi_{1-x}$, PZT film is formed placing 0.52 for x (indicated PZT (52·48) hereafter).

Further, Ir layer and $IrO_2$ layer are formed on the ferroelectric layer 6 by reactive spattering so as to use as an upper electrode (not shown) of double structure. Here, thickness thereof is formed in 200 nm. Thus, a ferroelectric capacitor is obtained.

In the ferroelectric capacitor formed such way, oxidation of the tungsten plug 3 does not appear, and oxidation of each layer does not appear.

Figure 15:
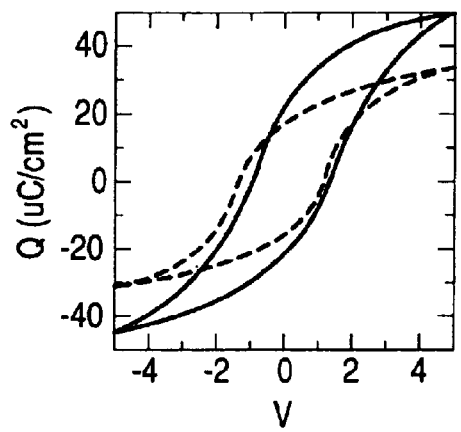
FIGS. 15(a) to 15(f) are views showing the results measuring hysteresis characteristic of ferroelectric memory according to the fifth embodiment of the present invention.
Figure 15:
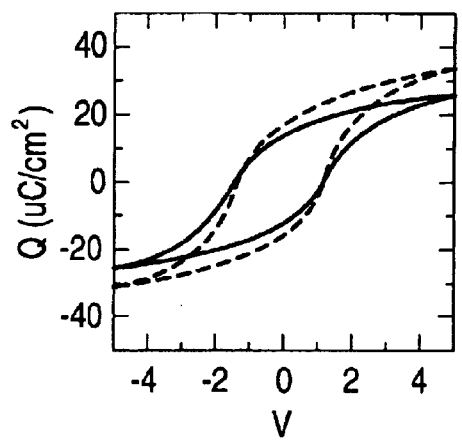
Figure 15:
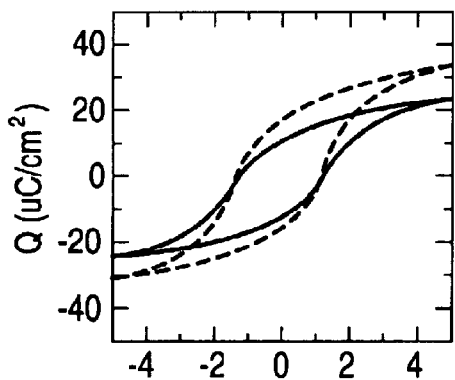
Figure 15:
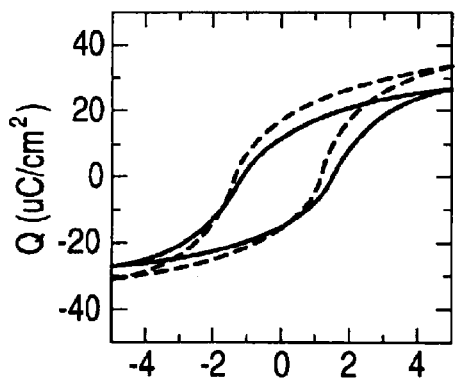
Figure 15:
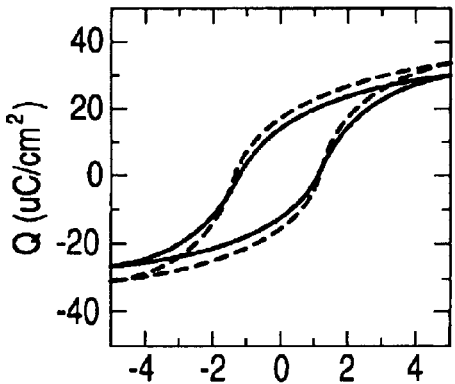
Figure 15:
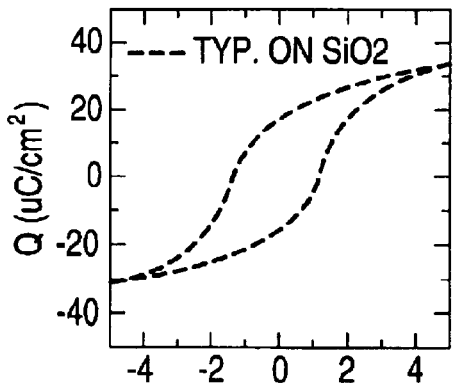

The result of measured hysteresis characteristic of ferroelectric capacitor (PZT(210 nm)/Pt(100 nm)/$IrO_2$(65 nm)/Ir (50 nm)/Ta(50 nm)/W(10 nm)) is shown in FIG. 15(c). For comparing, four structures are formed by varying composition of barrier layer without varying the electrode, the ferroelectric layer, and the substrate layer.

That is, the result of measured hysteresis characteristic of ferroelectric capacitor about the following structures are shown in FIGS. 15(b) to 15(e): the second structure; PZT (210 rim)/Pt (100 nm)/$IrO_2$ (65 nm)/Ir (50 nm)/$Ir_{0.4}Ta_{0.6}$ layer (50 nm)/W (100 nm), the third structure; PZT (210 nm)/Pt (100 nm)/$Iro_2$ (65 nm)/Ir (50 nm)/$Ir_{0.4}Ta_{0.6}$ layer (50 nm)/W (100 nm), the fourth structure; PZT (210 nm)/Pt (50 nm)/$IrO_2$ (65 nm)/Ir (50 nm)/$Ir_{0.4}Ta_{0.6}$ layer (50 nm)/W (100 nm), the fifth structure; PZT (210 nm)/Pt (100 nm)/$IrO_2$ (65 nm)/Ir (25 nm)/$Ir_{0.4}Ta_{0.6}$ layer (50 nm)/W (100 nm). For comparing, hysteresis characteristic of ferroelectric capacitor formed not on the tungsten plug but on oxide silicon layer is shown in FIG. 15(f).

Although in all cases, oxidation of IrTa appears a little, good hysteresis characteristic can be obtained in all cases. Peeling-off appeared at a part where thickness of film of the first barrier layer is thin.

Since crystallization anneal temperature is high, 745° C., it is known that any of them is used practically though oxidation appears a little.

About remanence, it is clear that depletion of Pr is improved considerably. Especially, when IrTa barrier layers are formed on both of the upper electrode and the lower electrode, it is clear that there is hardly any depletion till 100 cycles.

By the way, although IrTa is amorphous, the ferroelectric film formed on surface thereof, too, orientates well by forming a platinum layer on the upper layer.

Instead of the platinum layer, conductive layer good in orientation such as iridium, alloy of platinum and iridium, etc. may be provided. Especially, alloy of platinum and iridium can select grid constant by varying compounding ratio, and this grid constant can be matched easily to that of ferroelectric layer.

Although two layers structure film of titanium layer and titanium nitride layer are used as a bonding layer in the above-mentioned embodiment, any material improving bondability may be used. For example, platinum layer may be used.

Figure 16:
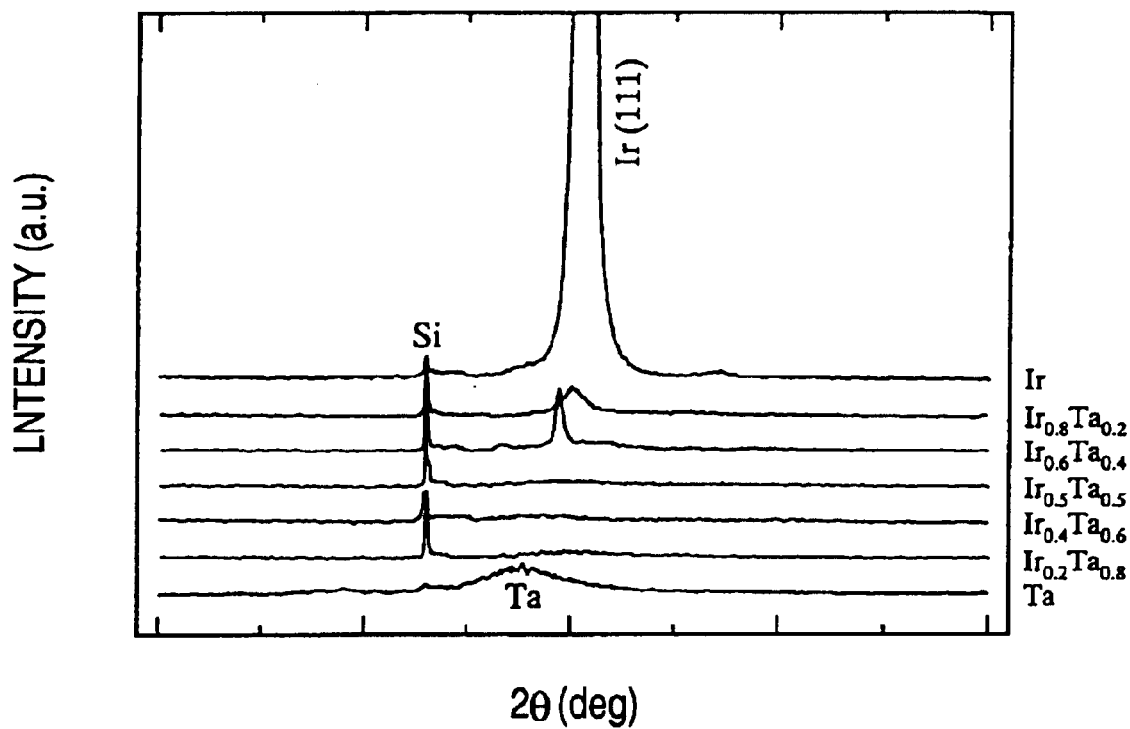
FIG. 16 is a view showing relation of composition of IrTa and peak value.
Figure 17:
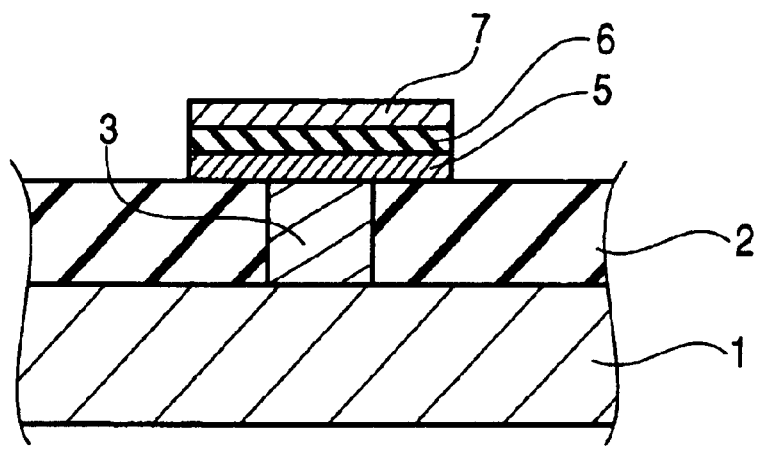
FIG. 17 is a view showing the conventional ferroelectric memory.
Figure 18:
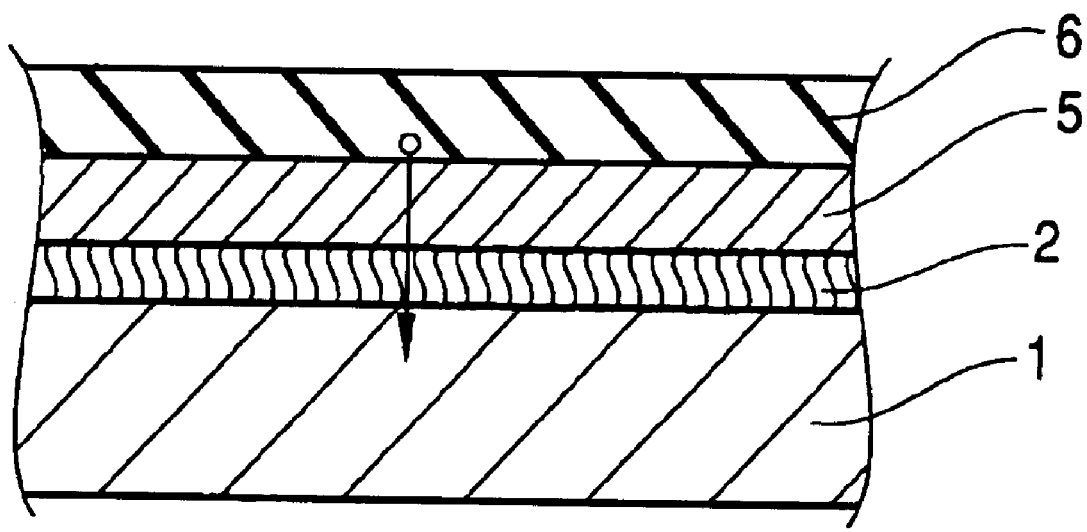
FIG. 18 is a view describing the conventional ferroelectric memory.

Next, peak characteristic greatly changes by varying a little composition ratio of IrTa as shown in FIG. 16. Therefore, it is possible to obtain suitable characteristic by adjusting a little composition ratio.

Although PZT is used as a ferroelectric film in the above-mentioned each embodiment, any material being oxide ferroelectric may be used. For example, $Ba_4Ti_3O_{12}$ and $SrBi_2Ta_2O_9$ may be used.

It is effective that a dielectric layer having high dielectric constant is used instead of the ferroelectric layer 6 as a capacitor according to another embodiment of the present invention. A lower electrode of platinum including the barrier layer of the present invention is provided on the tungsten plug formed on the oxide silicon layer 2, and thereon thin film of high dielectric constant having perovskite structure of $SrTiO_3$ and $(Sr, Ba) TiO_3$ is formed as dielectric layer. In this case too, dielectric is improved as similarly as ferroelectric. That is, it is clear that matters described about ferroelectric layer are applicable for dielectric layer having high dielectric constant.

Although ferroelectric capacitor is described in said embodiment, it is needless to say that the present invention is applicable for another process such as wiring passing through high temperature process without limiting to the capacitor.

As described above, according to the present invention, a barrier layer consisting of amorphous or microcrystal is included as an electrode being expressed by the following expression:

$$M1_xM2_{1-x} \ (0<x<1;$$

M1: Au, Pt, Ir, Pd, Os, Re, Rh, Ru, Cu, Co, Fe, Ni, V, Cr
M2: Ta, Ti, Zr, Hf, W, Y, Mo, Nb

The barrier effect is large so as to prevent mutual diffusion of oxygen etc. and spike because the barrier layer consisting of the amorphous or microcrystal does not have clear grain boundary. Therefore, escape of oxygen from dielectric layer can be prevented so as to depress aging dielectric characteristic. Dielectric thin film formed on the amorphous or microcrystal is good in orientation performance so as to be possible to provide dielectric structure high in reliability.

What is claimed is:

1. A semiconductor device having an electrode formed on a surface of a semiconductor substrate, wherein said electrode includes a barrier layer consisting of amorphous or microcrystal expressed by an expression of $M1_xM2_{1-x}$ (0<x<1), where M1 is selected from a group consisting of Au, Pt, Ir, Pd, Os, Re, Rh, Ru, Cu, Co, Fe, Ni, V, and Cr, and M2 is selected from a group consisting of Ta, Ti, Zr, Hf, W, Y, Mo, and Nb.

2. A semiconductor device according to claim 1, wherein composition ratio of said barrier layer is determined so that grain boundary becomes amorphous to an extend such that at least any one of diffusion of oxygen and spike can be prevented.

3. A semiconductor device according to claim 1, wherein said surface of semiconductor substrate is a tungsten plug formed on the semiconductor substrate.

4. A semiconductor device according to claim 1, wherein said surf ace of semiconductor substrate is formed by material which promotes oxidation at crystallization temperature of a dielectric layer to be formed on said surface of semiconductor.

5. A semiconductor device according to claim 1, wherein said surface of semiconductor substrate is formed by at least one kind of polysilicon, tungsten, cobalt, molybdenum, copper, silicide of these, and alloy of these.

6. A semiconductor device according to any one of claims 1 to 5, wherein a dielectric layer is formed on said surface of electrode.

7. A semiconductor device according to claim 6, wherein said dielectric layer is PZT.

8. A semiconductor device comprising:
a lower electrode formed on a semiconductor substrate;
a dielectric layer formed on said lower electrode and constructed by ferroelectric or dielectric having high dielectric constant; and
an upper electrode formed on said dielectric layer,
wherein said lower electrode includes a barrier layer consisting of amorphous or microcrystal expressed by an expression of $M1_xM2_{1-x}$ (0<x<1), where M1 is selected from a group consisting of Au, Pt, Ir, Pd, Os, Re, Rh, Ru, Cu, Co, Fe, Ni, V, and Cr, and M2 is selected from a group consisting of Ta, Ti, Zr, Hf, W, Y, Mo, and Nb.

9. A semiconductor device according to claim 8, wherein said barrier layer consists of iridium tantalum layer $Ir_xTa_{1-x}$ (0<x<1).

10. A semiconductor device according to claim 8, wherein said barrier layer includes a grading layer in which a composition ratio is changed.

11. A semiconductor device according to claim 8, wherein said barrier layer consists of iridium tantalum layer $Ir_xTa_{1-x}$ (0<x<1) and material of said electrode is iridium.

12. A semiconductor device according to claim 8, wherein said barrier layer consists of iridium tantalum layer $Ir_xTa_{1-x}$ (0<x<1) and material of said electrode is platinum.

13. A semiconductor device comprising:
a lower electrode formed on a semiconductor substrate;
a dielectric layer formed on said lower electrode and constructed by ferroelectric or dielectric having high dielectric constant;
an upper electrode formed on said dielectric layer; and
a barrier layer formed between said dielectric layer and said upper electrode, consisting of amorphous or microcrystal expressed by an expression of $M1_xM2_{1-x}$ (0<x<1), where M1 is selected from a group consisting of Au, Pt, Ir, Pd, Os, Re, Rh, Ru, Cu, Co, Fe, Ni, V, and Cr, and M2 is selected from a group consisting of Ta, Ti, Zr, Hf, W, Y, Mo, and Nb.

14. A semiconductor device according to claim 13, wherein said barrier layer consists of iridium tantalum layer $Ir_xTa_{1-x}$ (0<x<1).

15. A semiconductor device having
an electrode formed on a surface of a semiconductor substrate,
wherein said electrode is constructed by amorphous or microcrystal single layer expressed by an expression of $M1_xM^2_{1-x}$ (0<x<1), where M1 is selected from a group consisting of Au, Pt, Ir, Pd, Os, Re, Rh, Ru, Cu, Co, Fe, Ni, V, and Cr, and M2 is selected from a group consisting of Ta, Ti, Zr, Hf, W, Y, Mo, and Nb.

16. A semiconductor device according to claim 1, wherein said barrier layer includes of constructive element of substrate material.

17. A semiconductor device having
an electrode formed on a surface of a semiconductor substrate,
wherein said electrode includes an amorphous or microcrystal barrier layer made of IrTaPt.

18. A semiconductor device according to claim 1, wherein M1 contains Ir and M2 contains Hf.

* * * * *